(12) United States Patent
Yang et al.

(10) Patent No.: US 10,510,637 B2
(45) Date of Patent: Dec. 17, 2019

(54) DEVICES AND METHODS FOR HEAT DISSIPATION OF SEMICONDUCTOR INTEGRATED CIRCUITS

(71) Applicant: Taiwan Semiconductor Manufacturing Co., Ltd., Hsin-Chu (TW)

(72) Inventors: Chung-Chieh Yang, Zhubei (TW); Yung-Chow Peng, Hsinchu (TW); Chung-Peng Hsieh, Hsinchu (TW); Sa-Lly Liu, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 15/883,462

(22) Filed: Jan. 30, 2018

(65) Prior Publication Data

US 2019/0067150 A1 Feb. 28, 2019

Related U.S. Application Data

(60) Provisional application No. 62/552,176, filed on Aug. 30, 2017.

(51) Int. Cl.
*H01L 29/00* (2006.01)
*H01L 23/34* (2006.01)
*H01L 23/64* (2006.01)
*H01L 23/552* (2006.01)
*H01L 23/522* (2006.01)
*H01L 49/02* (2006.01)

(52) U.S. Cl.
CPC .......... *H01L 23/34* (2013.01); *H01L 23/5228* (2013.01); *H01L 23/552* (2013.01); *H01L 23/647* (2013.01); *H01L 28/00* (2013.01)

(58) Field of Classification Search
USPC ......................................................... 257/536
See application file for complete search history.

(56) References Cited

U.S. PATENT DOCUMENTS

2010/0127347 A1* 5/2010 Quinn ................. H01L 23/5223
257/532
2012/0068308 A1 3/2012 Igeta et al.
2018/0315769 A1* 11/2018 Huo ........................ H01L 29/10

FOREIGN PATENT DOCUMENTS

CN 105993071 A 10/2016

OTHER PUBLICATIONS

Official Action dated Jan. 14, 2019, in corresponding Taiwan Patent Application No. 10820024880.

* cited by examiner

*Primary Examiner* — Niki H Nguyen
(74) *Attorney, Agent, or Firm* — Duane Morris LLP

(57) ABSTRACT

A semiconductor device is disclosed. In one example, the semiconductor device includes: an electronic component having a top surface, a bottom surface, and two end portions; a plurality of contacts disposed on the top surface; and a plurality of metal nodes disposed on the plurality of contacts. The plurality of contacts includes two end contacts disposed at the two end portions respectively and at least one intermediate contact disposed between the two end contacts. The plurality of metal nodes includes two end metal nodes disposed on the two end contacts respectively and at least one intermediate metal node disposed on the at least one intermediate contact.

24 Claims, 14 Drawing Sheets

DEVICES AND METHODS FOR HEAT DISSIPATION OF SEMICONDUCTOR INTEGRATED CIRCUITS

CROSS-REFERENCE TO RELATED APPLICATION

The present application claims priority to U.S. Provisional Patent Application No. 62/552,176, filed on Aug. 30, 2017, which is incorporated by reference herein in its entirety.

BACKGROUND

An integrated circuit (IC) typically includes a large number of electronic components, such as resistors, transistors, capacitors, etc., on a chip of semiconductor material. The semiconductor IC industry has experienced rapid growth in the past several decades. Technological advances in semiconductor materials and design have produced increasingly smaller and more complex circuits. As the geometry size of an IC decreases, the practical significance of an electromigration (EM) effect of the IC increases. EM is the transport of material caused by gradual movement of ions in a conductor/resistor. A resistor under operation in an IC generates heat and increases temperature of the IC, which is known as Joule heating. EM is exacerbated by a high Joule heating of the resistor, which can lead to eventual failure of electrical components in the IC.

The thermal distribution of a resistor under operation is typically not uniform. According to the physical structure of the resistor, contacts at two sides of the resistor are connected to colder devices or metals, to serve as heat dissipation paths. While lower temperatures can be observed at the two sides of the resistor, the resistor's center area forms a thermal hot spot. In this case, the resistor's center area has the highest temperature and forms the weakest point in terms of EM. Especially, the center temperature of the resistor becomes higher when the resistor has a larger length and/or a larger current. While conventional techniques use edge contacts to relax temperatures at a resistor's edges by heat dissipation, the resistor's center remains as a hot spot and an EM critical area. Thus, conventional techniques for heat dissipation of resistors in an IC are not entirely satisfactory.

BRIEF DESCRIPTION OF THE DRAWINGS

Aspects of the present disclosure are best understood from the following detailed description when read with the accompanying figures. It is noted that various features are not necessarily drawn to scale. In fact, the dimensions and geometries of the various features may be arbitrarily increased or reduced for clarity of discussion. Like reference numerals denote like features throughout specification and drawings.

DETAILED DESCRIPTION

Figure 1:
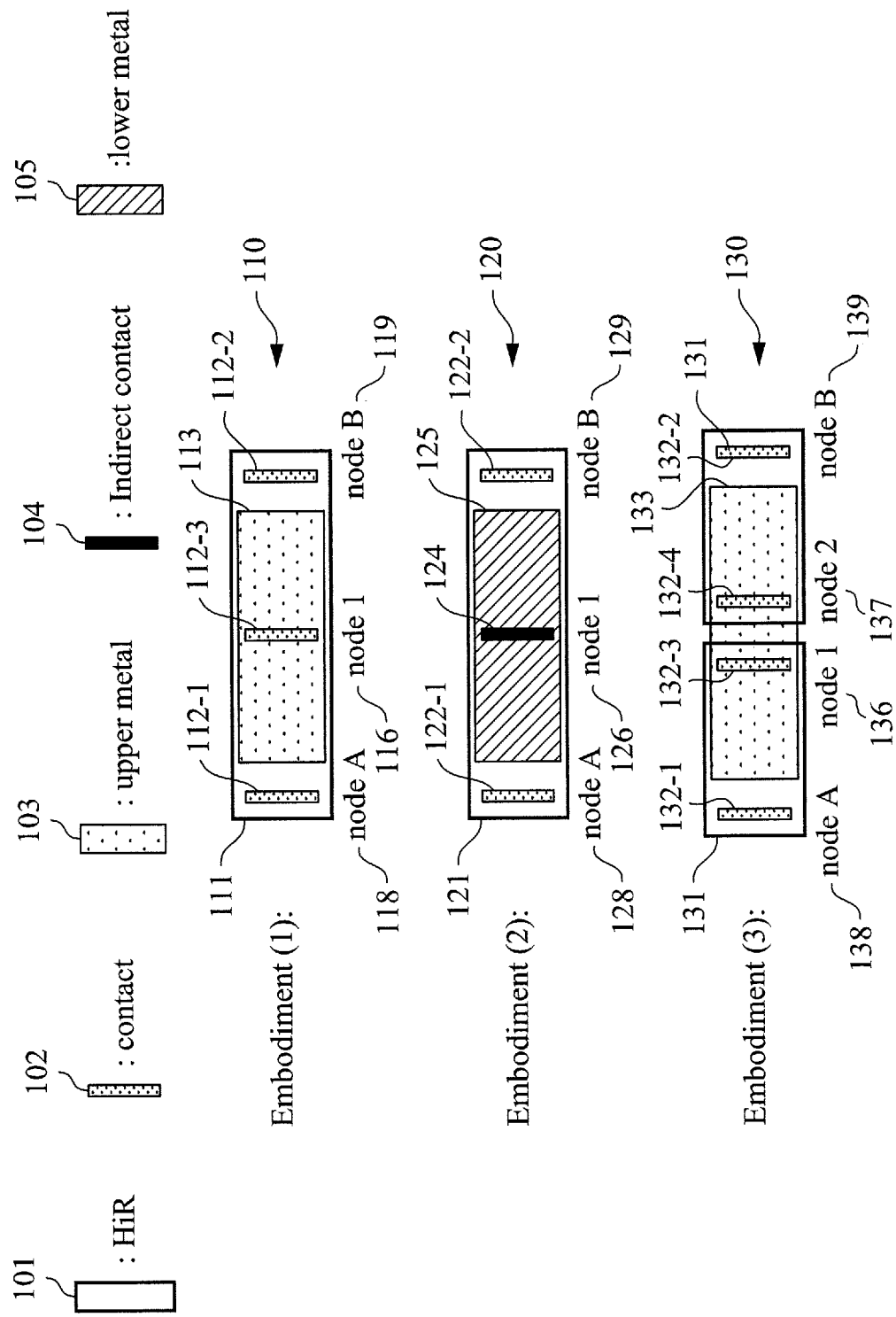
FIG. 1 illustrates top views of exemplary semiconductor devices, in accordance with various embodiments of the present disclosure.

The following disclosure describes various exemplary embodiments for implementing different features of the subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

While edge/end contacts have been used to reduce temperature of a resistor, the resistor's center area remains to be a hot spot. One way to relax the temperature of the resistor's center area is dividing the resistor into two resistors in parallel. For example, a resistor with a width of 1 µm can be divided to two resistors in parallel, each with a width of 0.5 µm. The increased overall surface of the two resistors gains benefits to thermal radiation. But each of the two resistors' center area is still a hot spot, compared to other areas of the two resistors.

The present disclosure aims at improving resistors' EM effect in an IC by relaxing the resistors' Joule heating at the hot spot area, in order to reduce the temperatures around resistors in the IC during operation. The present disclosure provides various embodiments of a semiconductor device (e.g. a semiconductor IC) that includes a resistor with both two end metal nodes disposed at two end portions of the resistor and at least one intermediate metal node disposed between the two end portions, and methods of forming the semiconductor device. The resistor has a top surface, a bottom surface, and two end portions. The at least one intermediate metal node can serve as a heat sink inserted to the resistor for heat dissipation of the resistor.

In some embodiments, each of the end metal nodes and the at least one intermediate metal node is disposed on a contact that is in direct contact with the top surface. The at least one intermediate metal node in these embodiments can thermally couple the resistor to a ground plane or a power plane in the device for heat dissipation.

In other embodiments, the device comprises a dielectric layer disposed below the bottom surface of the resistor, and the at least one intermediate metal node is disposed below the dielectric layer such that the at least one intermediate metal node has indirect contact with the resistor. The at least one intermediate metal node in these embodiments can thermally couple the resistor to a substrate in the device for heat dissipation.

In yet other embodiments, the resistor is a resistor layer including a plurality of sub-resistors connected in series. In these embodiments, each sub-resistor has a top surface, a bottom surface, and two end portions. A metal node is disposed on each end portion of each sub-resistor; and any two metal nodes disposed over two adjacent end portions of two adjacent sub-resistors are thermally coupled to form a pair of coupled metal nodes which may be treated as an intermediate metal node pair for heat dissipation of the resistor. An intermediate metal node pair may be disposed on the top surface via a pair of contacts and thermally couple the resistor to a ground plane or a power plane in the device for heat dissipation; or may be disposed below a dielectric layer under the resistor and thermally couple the resistor to a substrate in the device for heat dissipation.

As dimensions of semiconductor devices continue to decrease and packaging densities continue to increase, parasitic capacitance becomes more and more important to improve the operating speed of the devices. To reduce the parasitic capacitance at the area overlapping between the intermediate metal node and the substrate, the present disclosure provides a method for designing a geometry shape and size of the intermediate metal node such that the metal node is in parallel with the resistor or fully covered by the resistor area.

It can be understood that although the description in the present disclosure focuses on resistor usage in integrated circuits (ICs), the present disclosure is applicable to all kinds of electronic components that can produce heat in an electronic circuit due to passage of an electric current. The disclosed semiconductor device structure can especially benefit those resistors, e.g. termination resistors, with high-current usages, by decreasing temperature in a resistor's center area (EM critical area) and suppressing the increase of parasitic capacitance brought by heat sink insertion.

FIG. 1 illustrates top views of exemplary semiconductor devices, in accordance with various embodiments of the present disclosure. FIG. 1 shows three embodiments for inserting a heat sink, e.g. an upper metal 103 via a contact 102 or a lower metal 105 via an indirect contact 104, in a resistor, e.g. a high resistance (HiR) resistor 101, for heat dissipation. In accordance with various embodiments, a HiR resistor is formed of a high resistance material, e.g. Titanium nitride (TiN) or Tantalum nitride (TaN).

In embodiment (1) 110, two end nodes (node A 118 and node B 119) are disposed on a HiR resistor 111 via two end contacts 112-1, 112-2 to form heat dissipation paths. As discussed above, if the resistor only has these two end nodes on the two ends of the resistor, heat will be clouded and accumulated at center of the resistor. As such, the HiR resistor 111 also has an intermediate node (node 1 116) inserted between the two ends to serve as a heat sink for reducing temperature of the center area of the HiR resistor 111. The node 1 116 here includes an upper metal 113 disposed on a contact 112 that is in direct contact with a top surface of the HiR resistor 111, such that heat in the center of the HiR resistor 111 can be dissipated via the node 1 116 to a large heat sink pool in the semiconductor device. For example, when the device in embodiment (1) is a semiconductor IC, the node 1 116 may thermally couple the HiR resistor 111 to a mesh power/ground plane that can further dissipate heat out of the IC. The size of the upper metal 113 could be optimized according to electrical and thermal performance requirement of the device. Compared with a conventional device that does not include the intermediate node 116, the device in this embodiment has a similar electrical performance and may have just a minor parasitic capacitance overhead. To reduce the parasitic capacitance introduced by the inserted heat sink, one can design heat sink metal shapes to make the metal 113 run in parallel with the resistor 111 and/or be fully covered by the area of the resistor 111. Details of geometry design of the metal node will be discussed later.

In embodiment (2) 120, two end nodes (node A 128 and node B 129) are disposed on a HiR resistor 121 via two end contacts 122-1, 122-2 to form heat dissipation paths. To reduce heat clouded and accumulated at center of the resistor 121, the HiR resistor 121 also has an intermediate node (node 1 126) inserted between the two ends to serve as a heat sink. The node 1 126 here includes a lower metal 125 disposed below an indirect contact 124 below a bottom surface of the HiR resistor 121, such that heat in the center of the HiR resistor 121 can be dissipated via the node 1 126 to a large heat sink pool in the semiconductor device. For example, when the device in embodiment (2) is a semiconductor IC, the node 1 126 may thermally couple the HiR resistor 121 to a substrate, e.g. a bulk complementary metal-oxide-semiconductor (CMOS) or a silicon on insulator (SOI) CMOS, that can further dissipate heat out of the IC. The size of the lower metal 125 could be optimized according to electrical and thermal performance requirement of the device. Compared with a conventional device that does not include the intermediate node 126, the device in this embodiment has a similar electrical performance and may have some parasitic capacitance overhead. The 120 in FIG. 1 may introduce more parasitic capacitance to the device, because the underneath heat sink 126 is not only a thermal conductor but also an "electrical conductor" that brings more parasitic capacitance to the device due to an unavoidable larger electrical coupling to the substrate. Details of geometry design of the metal node will be discussed later.

In the present disclosure, unless stated otherwise, the electrical current in a resistor has a flowing direction from node A to node B.

In embodiment (3) 130, a HiR resistor 131 includes two separated resistor units (sub-resistors) connected in series. For example, one 10 ohm resistor can be divided into two 5 ohms resistors that are connected in series. Two edge taps or end nodes (node A 138 and node B 139) are disposed on the resistor 131 via two end contacts 132-1, 132-2 to form heat dissipation paths. In addition, there are intermediate nodes (node 1 136 and node 2 137) inserted between the two ends to serve as a heat sink for reducing temperature of the center area of the HiR resistor 131. In this embodiment, the two intermediate nodes are disposed on two adjacent ends of two adjacent sub-resistors and form a thermally coupled node pair, e.g. by a single piece of metal covering the two intermediate nodes. The metal may be either an upper metal 133 disposed on contacts 132 that are in direct contact with a top surface of the HiR resistor 131 as shown in FIG. 1, or a lower metal disposed below indirect contacts below a bottom surface of the HiR resistor 131 (not shown). As such, heat in the center area of the HiR resistor 131, i.e. in the connected area of the two sub-resistors in embodiment (3) 130, can be dissipated via the coupled node pair (136-137) to a large heat sink pool in the semiconductor device. For example, when the device in embodiment (3) is a semiconductor IC, the coupled node pair (136-137) may thermally couple the HiR resistor 131, either up to a mesh power/ground plane or down to a bulk or SOI CMOS, to further dissipate the heat out of the IC. To reduce the parasitic capacitance introduced by the inserted heat sink, one can design heat sink metal pair shapes to make the metal 133 run in parallel with the resistor 131 and/or be fully covered by the area of the resistor 131, in similar manners as that in embodiment (1). In one example, the intermediate nodes in embodiment (3) are not all disposed at end portions of the sub-resistors, especially when the sub-resistors have different lengths or sizes. In another example, each of the intermediate nodes in embodiment (3) is disposed at an end portion of a sub-resistor, and any two intermediate nodes at two adjacent sub-resistor ends form a thermally coupled node pair as shown in FIG. 1, which can make use of existing heat sink structure to build up new heat sink insertion for serially connected resistors.

Figure 2:
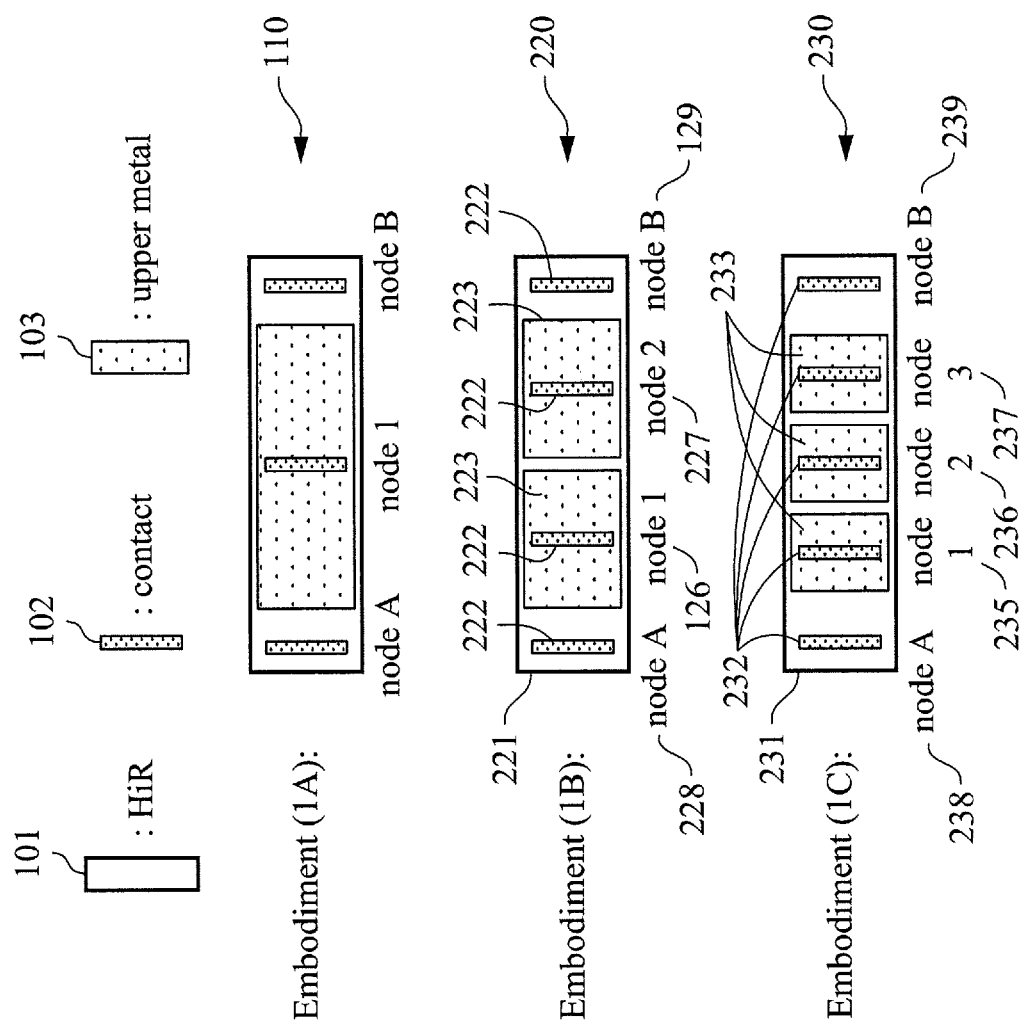
FIG. 2 illustrates top views of a first set of exemplary semiconductor devices, in accordance with some embodiments of the present disclosure.

FIG. 2 illustrates top views of a first set of exemplary semiconductor devices, in accordance with some embodiments of the present disclosure. FIG. 2 illustrates different versions of embodiment (1) in FIG. 1. For example, the embodiment (1A) 110 in FIG. 2 is the same as the embodiment (1) 110 in FIG. 1, where one intermediate node (node 1) is inserted between two ends of the resistor for heat dissipation.

In embodiment (1B) 220 in FIG. 2, in addition to the two end nodes (node A 228 and node B 229) disposed on the HiR resistor 221 via two end contacts 222, two intermediate nodes (node 1 226 and node 2 227) are inserted between two end portions of the resistor 221 for heat dissipation. Each of the two intermediate nodes includes an upper metal 223 disposed on a contact 222 that is in direct contact with a top surface of the HiR resistor 221, such that heat in the center of the HiR resistor 221 can be dissipated via the two intermediate nodes to a large heat sink pool in the semiconductor device.

In embodiment (1C) 230 in FIG. 2, in addition to the two end nodes (node A 238 and node B 239), three intermediate nodes (node 1 235, node 2 236, and node 3 237) are inserted between two end portions of the resistor 231 for heat dissipation. Each of the three intermediate nodes includes an upper metal 233 disposed on a contact 232 that is in direct contact with a top surface of the HiR resistor 231, such that heat in the center of the HiR resistor 231 can be dissipated via the two intermediate nodes to a large heat sink pool in the semiconductor device.

It can be understood that in some embodiments, the number of intermediate nodes inserted on the resistor can be larger than three. It can also be understood that in some embodiments, the locations of the intermediate nodes disposed on the resistors do not have to be evenly distributed on the resistor as shown in FIG. 2. For example, when a resistor has one end wider than the other end, or when a resistor has different material on different portions of the resistor, the heat sinks (intermediate metal nodes) can be distributed to correspond to hottest spots on the resistor, e.g. based on experiments or measurements.

Figure 3:
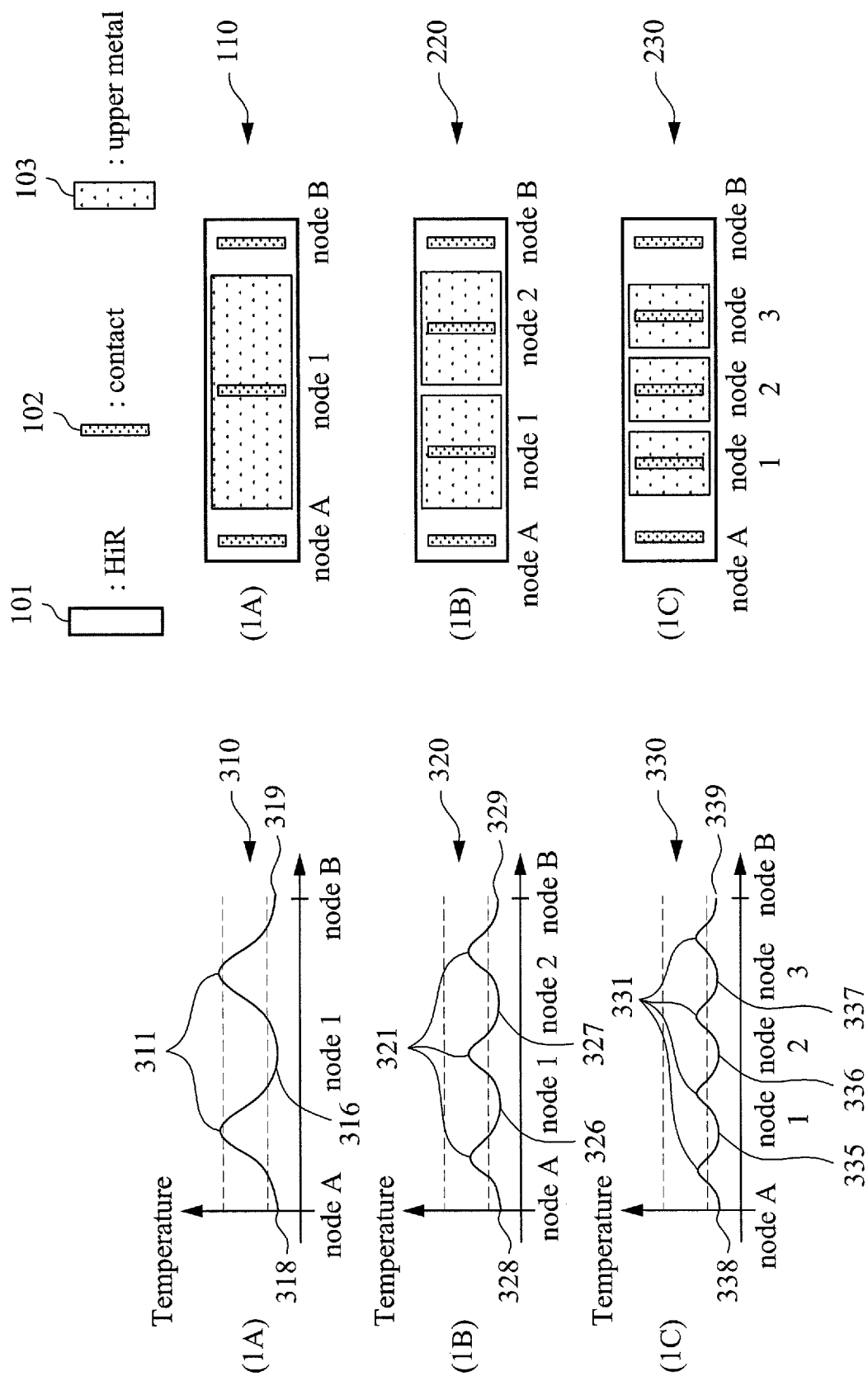
FIG. 3 illustrates temperature distributions of the exemplary semiconductor devices shown in FIG. 2, in accordance with some embodiments of the present disclosure.

FIG. 3 illustrates temperature distributions of the exemplary semiconductor devices shown in FIG. 2, in accordance with some embodiments of the present disclosure. For the embodiments (1A) 110, (1B) 220, (1C) 230, FIG. 3 shows corresponding temperature distributions 310, 320, 330, respectively, along an axis from node A to node B of the resistor.

As shown in FIG. 3, the temperature distribution 310 for the embodiment (1A) 110 has two low points 318, 319 at the two end nodes and one low point 316 at the intermediate node 1. As the intermediate node 1 is located at the center of the resistor, there is no big hot spot at the resistor center in contrast to a conventional device without intermediate node, but there are two smaller hot spots 311 in between the nodes. In addition, compared to a conventional device without intermediate node, the overall temperature of the resistor in this embodiment is reduced.

The temperature distribution 320 for the embodiment (1B) 220 has two low points 328, 329 at the two end nodes and two low points 326, 327 at the intermediate nodes 1 and 2. Unlike a conventional device without intermediate node, there is no big hot spot at the resistor center here, but there are three smaller hot spots 321 in between the nodes. In addition, compared to a conventional device without intermediate node, the overall temperature of the resistor in this embodiment is reduced.

Similarly, the temperature distribution 330 for the embodiment (1C) 230 has two low points 338, 339 at the two end nodes and three low points 335, 336, 337 at the intermediate nodes 1, 2 and 3. Unlike a conventional device without intermediate node, there is no big hot spot at the resistor center here, but there are four smaller hot spots 331 in between the nodes. In addition, compared to a conventional device without intermediate node, the overall temperature of the resistor in this embodiment is reduced.

As shown in FIG. 3, more intermediate nodes inserted between two ends of the resistor can bring a lower overall temperature and a flatter temperature distribution for the resistor. On the other hand, more intermediate nodes may mean more cost for the device. As such, one can determine an optimal number of intermediate nodes based on the tradeoff between temperature reduction and cost increase, as well as other concerns like resistor and node geometry, performance requirement, etc.

Figure 4:
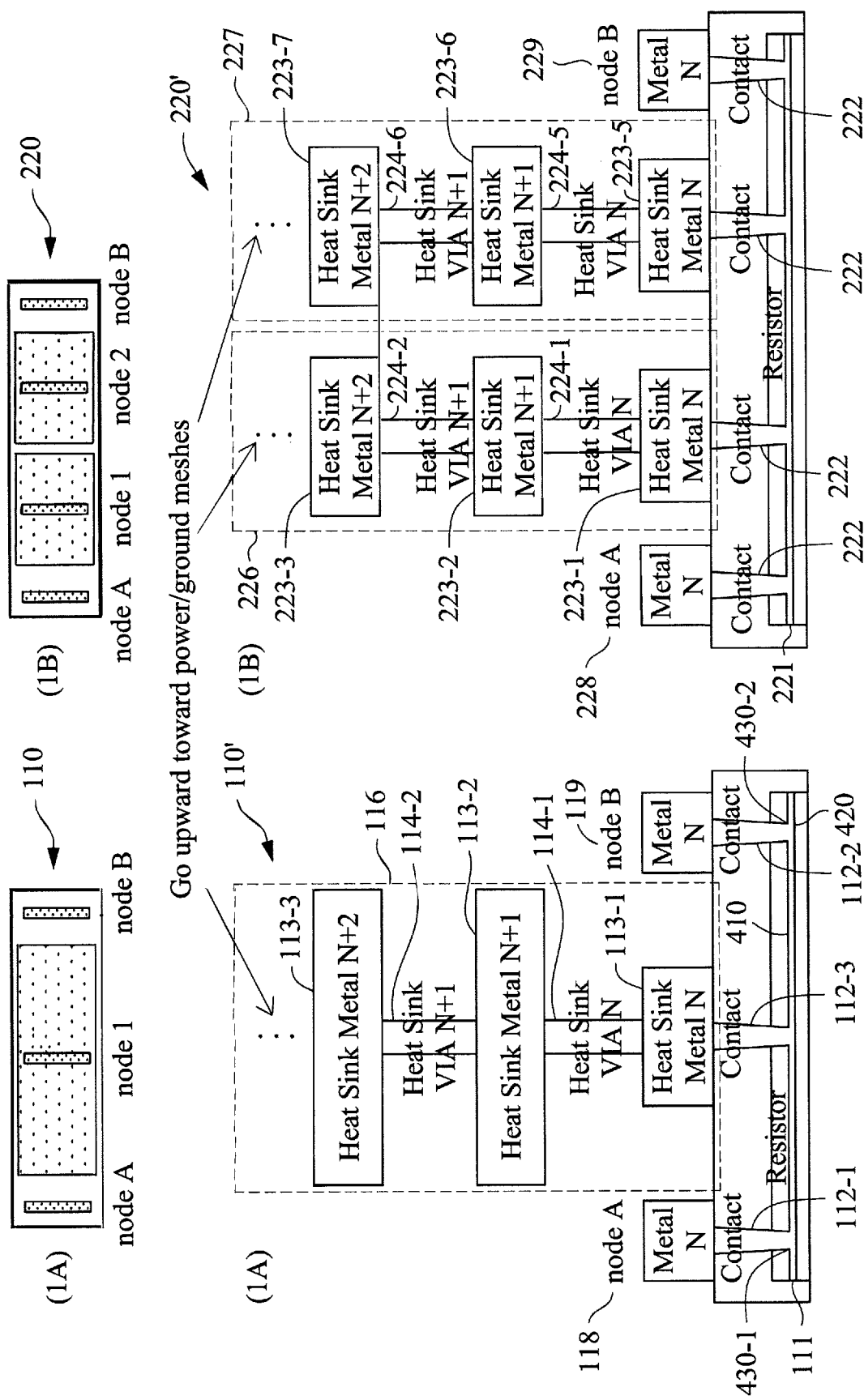
FIG. 4 illustrates corresponding cross-sectional views of some of the exemplary semiconductor devices shown in FIG. 2, in accordance with some embodiments of the present disclosure.

FIG. 4 illustrates corresponding cross-sectional views of some of the exemplary semiconductor devices shown in FIG. 2, in accordance with some embodiments of the present disclosure.

FIG. 4 shows a cross-sectional view 110' for the embodiment (1A). In the cross-sectional view 110', the resistor 111 has a top surface 410, a bottom surface 420, and two end portions 430-1, 430-2. There are three contacts 112 disposed on the top surface 410 of the resistor 111, including two end contacts disposed at the two end portions 430-1, 430-2 of the resistor and one intermediate contact disposed at the center of the resistor 111. In can be understood that the intermediate contact may be disposed anywhere between the two end portions according to different embodiments. There are two end nodes (node A 118 and node B 119) disposed on the two end contacts 112-1, 112-2 and one intermediate node 116 disposed on the intermediate contact 112-3. The node 116 in this example includes a plurality of metal layers (heat sink metals N 113-1, N+1 113-2, N+2 113-3, ... ) and at least one vertical interconnect access (via) (heat sink vias N 114-1, N+1 114-2, ... ) that thermally couples adjacent metal layers in the plurality of metal layers. The heat in the center of the resistor 111 can be dissipated via the node 116 to a large heat sink pool (e.g., a mesh power/ground plane) in the semiconductor device.

FIG. 4 also shows a cross-sectional view 220' for the embodiment (1B). In the cross-sectional view 220', four contacts 222 are disposed on the resistor 221, including two end contacts disposed at the two end portions of the resistor and two intermediate contacts disposed between the two end portions. There are two end nodes (node A 228 and node B 229) disposed on the two end contacts 222 and two intermediate nodes 226, 227 disposed on the two intermediate contacts 222. Each of the two intermediate nodes 226, 227 in this example includes a plurality of metal layers and at least one vertical interconnect access (via) that thermally couples adjacent metal layers in the plurality of metal layers. For example, the intermediate node 226 in this example includes heat sink metals N 223-1, N+1 223-2, N+2 223-3, etc. and heat sink vias N 224-1, N+1 224-2, etc. that thermally couple adjacent heat sink metals. The heat in the center of the resistor 221 can be dissipated via the two intermediate nodes 226, 227 to a large heat sink pool (e.g. a mesh power/ground plane) in the semiconductor device.

In accordance with some embodiments, the contacts on top of a resistor may be formed of Tungsten. In accordance with some embodiments, each metal layer or each heat sink metal may be formed of an aluminum alloy.

In accordance with some embodiments, one can optimize the number of metal layers in an intermediate node, based on size of the device, cost of the device, material of the metal layers, and material of other portions of the device, etc. It can be understood that, when there are multiple intermediate nodes on the resistor, the numbers and/or material of metal layers in different intermediate nodes can be different.

Figure 5:
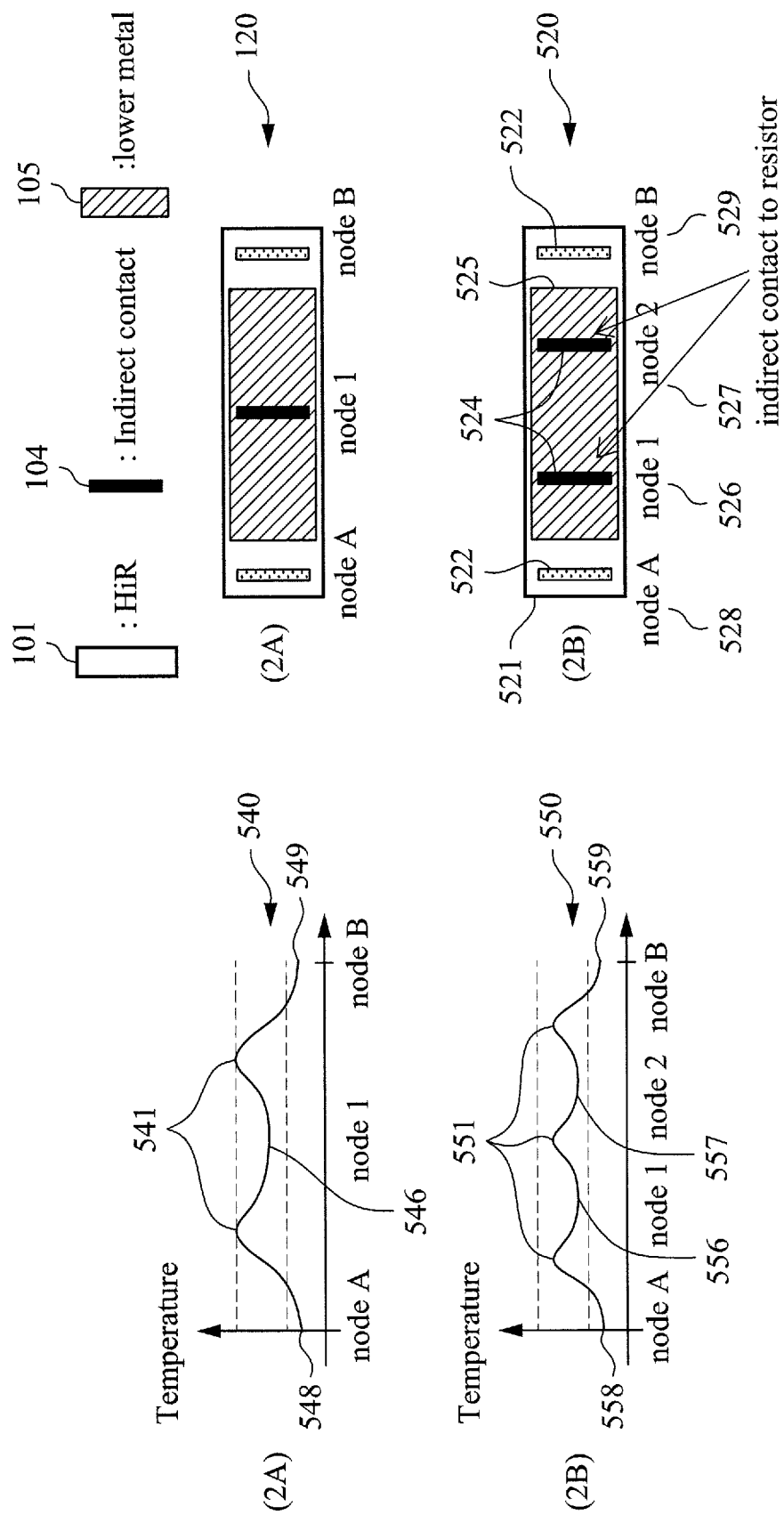
FIG. 5 illustrates top views and temperature distributions of a second set of exemplary semiconductor devices, in accordance with some embodiments of the present disclosure.

FIG. 5 illustrates top views and temperature distributions of a second set of exemplary semiconductor devices, in accordance with some embodiments of the present disclosure. FIG. 5 illustrates different versions of embodiment (2) in FIG. 1. For example, the embodiment (2A) 120 in FIG. 5 is the same as the embodiment (2) 120 in FIG. 1, where one intermediate node (node 1) is inserted between two ends of the resistor and below the resistor for heat dissipation.

In embodiment (2B) 520 in FIG. 5, in addition to the two end nodes (node A 528 and node B 529) disposed on the resistor 521 via two end contacts 522, two intermediate nodes (node 1 526 and node 2 527) are inserted between two end portions of the resistor 521 and below the resistor 521 for heat dissipation. Each of the two intermediate nodes includes a lower metal 525 disposed below an indirect contact 524 below a bottom surface of the resistor 521, such that heat in the center of the resistor 521 can be dissipated via the two intermediate nodes to a large heat sink pool (e.g. a bulk or SOI CMOS) in the semiconductor device.

It can be understood that in some embodiments, the number of intermediate nodes inserted below the resistor can be larger than two. It can also be understood that in some embodiments, the locations of the intermediate nodes disposed below the resistors do not have to be evenly distributed on the resistor as shown in FIG. 5.

For the embodiments (2A) 120 and (2B) 520, FIG. 5 shows corresponding temperature distributions 540 and 550, respectively, along an axis from node A to node B of the resistor. As shown in FIG. 5, the temperature distribution 540 for the embodiment (2A) 120 has two lowest points 548, 549 at the two end nodes and one low point 546 at the intermediate node 1. As the intermediate node 1 is located at the center of the resistor, there is no big hot spot at the resistor center in contrast to a conventional device without intermediate node, but there are two smaller hot spots 541 in between the nodes. In addition, compared to a conventional device without intermediate node, the overall temperature of the resistor in this embodiment is reduced.

It is observed that, in this example, the temperature at node 1 is higher than that at nodes A and B. It can also be observed that, compared to the temperature distribution 310 in FIG. 3, the temperature at node 1 546 in FIG. 5 is higher than that at node 1 316 in FIG. 3. These observations may indicate that a direct contact heat sink works better than an indirect contact heat sink, when other parameters of the heat sinks are comparable.

Similarly, the temperature distribution 550 for the embodiment (2B) 520 has two low points 558, 559 at the two end nodes and two low points 556, 557 at the intermediate nodes 1 and 2. Unlike a conventional device without intermediate node, there is no big hot spot at the resistor center here, but there are three smaller hot spots 551 in between the nodes. In addition, compared to a conventional device without intermediate node, the overall temperature of the resistor in this embodiment is reduced.

As shown in FIG. 5, more intermediate nodes inserted between two ends of the resistor can bring a lower overall temperature and a flatter temperature distribution for the resistor. On the other hand, more intermediate nodes may mean more cost for the device. As such, one can determine an optimal number of intermediate nodes based on the tradeoff between temperature reduction and cost increase, as well as other concerns like resistor and node geometry, performance requirement, etc.

Figure 6:
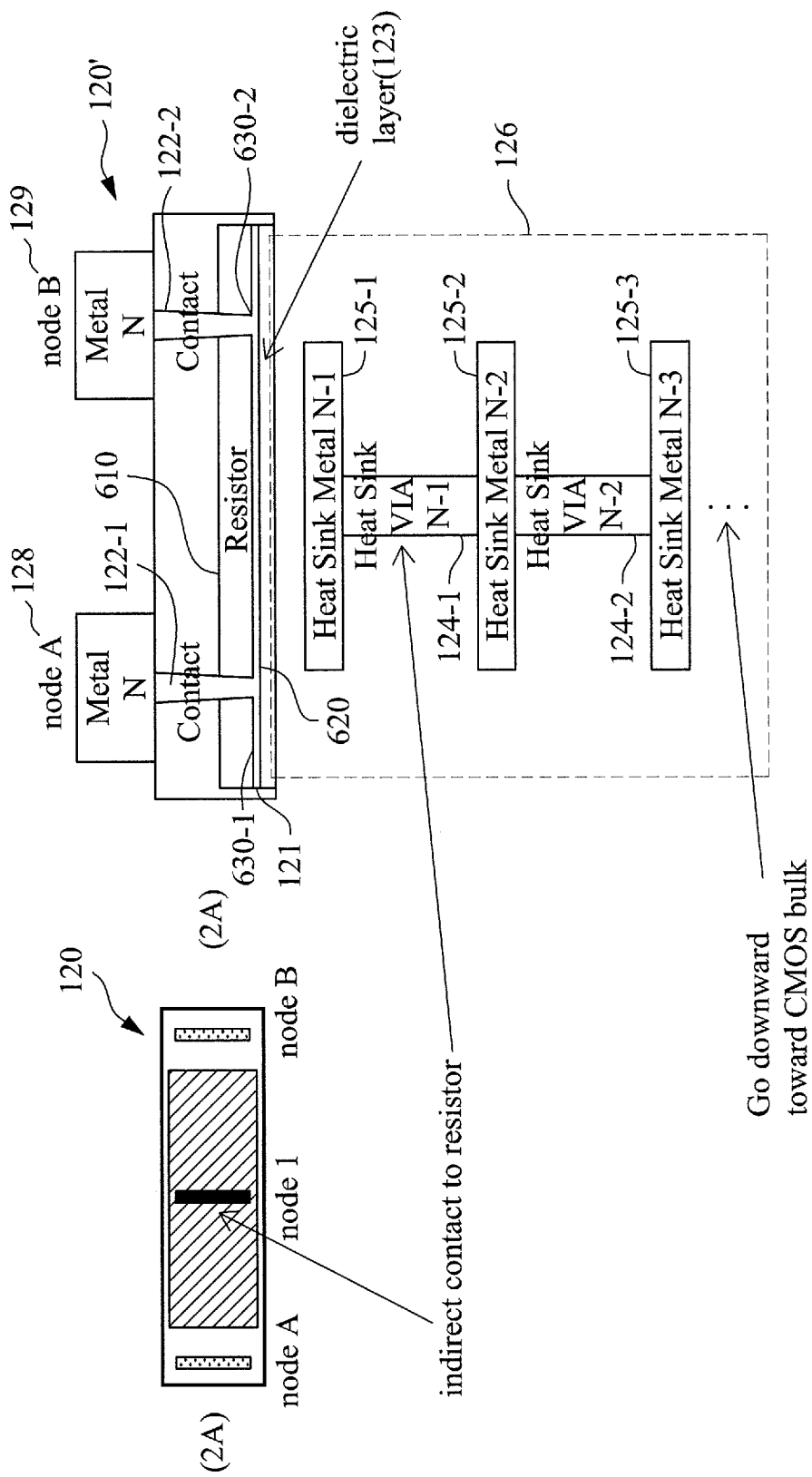
FIG. 6 illustrates a corresponding cross-sectional view of one of the exemplary semiconductor devices shown in FIG. 5, in accordance with some embodiments of the present disclosure.

FIG. 6 illustrates a corresponding cross-sectional view of one of the exemplary semiconductor devices shown in FIG. 5, in accordance with some embodiments of the present disclosure. FIG. 6 shows a cross-sectional view 120' for the embodiment (2A). As shown in the cross-sectional view 120', the resistor 121 has a top surface 610, a bottom surface 620, and two end portions 630-1, 630-2. There are two end contacts 122-1, 122-2 disposed on the top surface 610 at the two end portions 630-1, 630-2 of the resistor 121; and two end nodes (node A 128 and node B 129) disposed on the two end contacts 122-1, 122-2. In addition, the resistor 121 is covered by a dielectric layer 123 as shown in FIG. 6. An intermediate node 126 is disposed below the dielectric layer 123 and between the two end portions of the resistor 121. The node 126 in this example includes a plurality of metal layers (heat sink metals N−1 125-1, N−2 125-2, N−3 125-3, . . . ) and at least one via (heat sink vias N−1 124-1, N−2 124-2, . . . ) that thermally couples adjacent metal layers in the plurality of metal layers. The heat in the center of the resistor 121 can be dissipated via the node 126 to a large heat sink pool (e.g. a substrate like a bulk or SOI CMOS) in the semiconductor device. In accordance with some embodiments, each metal layer or each heat sink metal may be formed of an aluminum alloy.

In accordance with some embodiments, one can optimize the number of metal layers in an intermediate node, based on size of the device, cost of the device, material of the metal layers, and material of other portions of the device, etc. It can be understood that, when there are multiple intermediate nodes disposed below the resistor, the numbers and/or material of metal layers in different intermediate nodes can be different. It can also be understood that, in some embodiments, one resistor may have both an intermediate metal node disposed on top of the resistor and an intermediate metal node disposed below the resistor.

Figure 7:
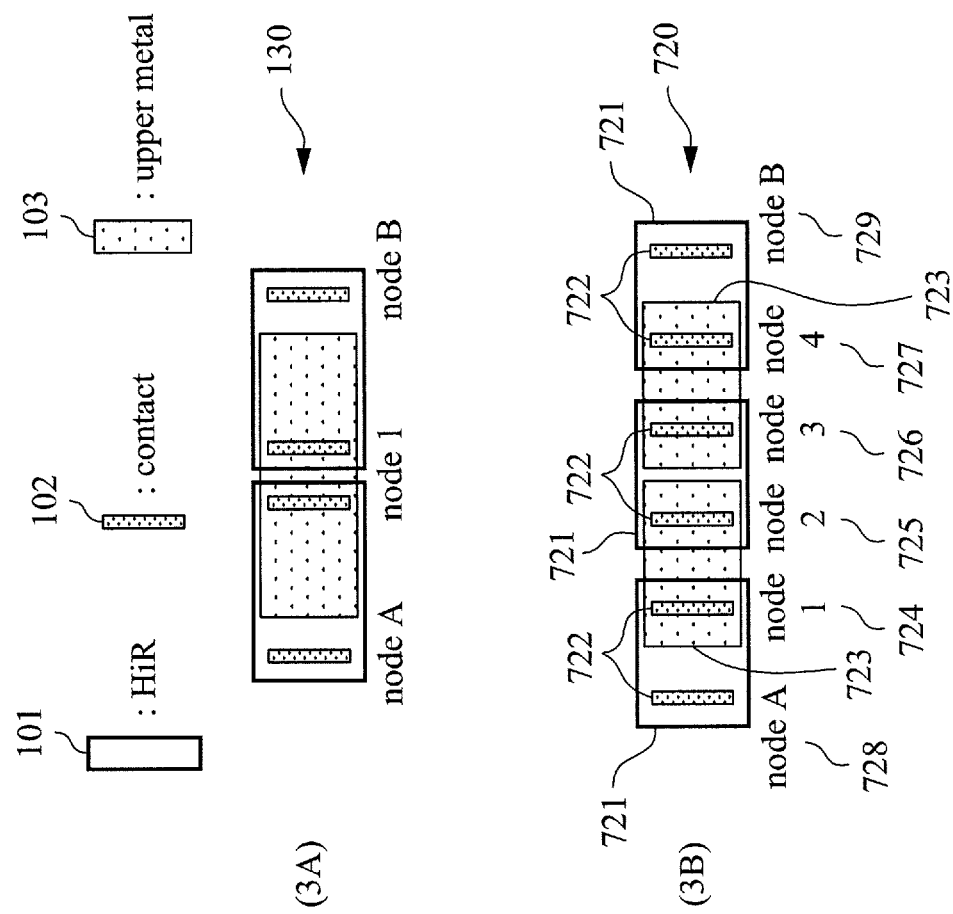
FIG. 7 illustrates top views of a third set of exemplary semiconductor devices, in accordance with some embodiments of the present disclosure.

FIG. 7 illustrates top views of a third set of exemplary semiconductor devices, in accordance with some embodiments of the present disclosure. FIG. 7 illustrates different versions of embodiment (3) in FIG. 1. For example, the embodiment (3A) 130 in FIG. 7 is the same as the embodiment (3) 130 in FIG. 1, where the resistor includes two sub-resistors connected in series, an intermediate node is disposed at each end portion of each sub-resistor, and any two intermediate nodes at two adjacent sub-resistor ends form a thermally coupled node pair for heat dissipation of the resistor.

In embodiment (3B) 720 in FIG. 7, the resistor 721 includes three sub-resistors connected in series. Two edge taps or end nodes (node A 728 and node B 729) are disposed on the resistor 721 via two end contacts 722 to form heat dissipation paths. In addition, there are intermediate nodes (nodes 1-4, 724, 725, 726, 727) inserted between the two ends to serve as heat sinks for reducing temperature of the center area of the resistor 721. In this embodiment, any two intermediate nodes disposed on two adjacent ends of two adjacent sub-resistors form a thermally coupled node pair, e.g. My a single piece of metal covering the two intermediate nodes. The metal may be either an upper metal 723 disposed on contacts 722 that are in direct contact with a top surface of the resistor 721 as shown in FIG. 7, or a lower metal disposed below indirect contacts below a bottom surface of the resistor 721 (not shown). As such, heat between the two end portions of the resistor 721 can be dissipated via the coupled node pairs (724-725, 726-727) to a large heat sink pool, e.g. either up to a mesh power/ground plane or down to a bulk or SOI CMOS, to further dissipate the heat out of the semiconductor device. In one example, the intermediate nodes in embodiment (3B) are not all disposed at end portions of the sub-resistors, especially when the sub-resistors have different lengths or sizes. In another example, each of the intermediate nodes in embodiment (3B) is disposed at an end portion of a sub-resistor, and any two intermediate nodes at two adjacent sub-resistor ends form a thermally coupled node pair as shown in FIG. 7, which can make use of existing heat sink structure to build up new heat sink insertion for serially connected resistors.

It can be understood that in some embodiments, the number of sub-resistors in the resistor can be larger than three. It can also be understood that in some embodiments, the shapes and/or sizes of the sub-resistors are different from each other. In some embodiment, one sub-resistor is wider than another sub-resistor, or has different material than another sub-resistor. In this case, the heat sinks (intermediate metal nodes) can be distributed to correspond to hottest spots on the sub-resistors, e.g. based on experiments or measurements.

Figure 8:
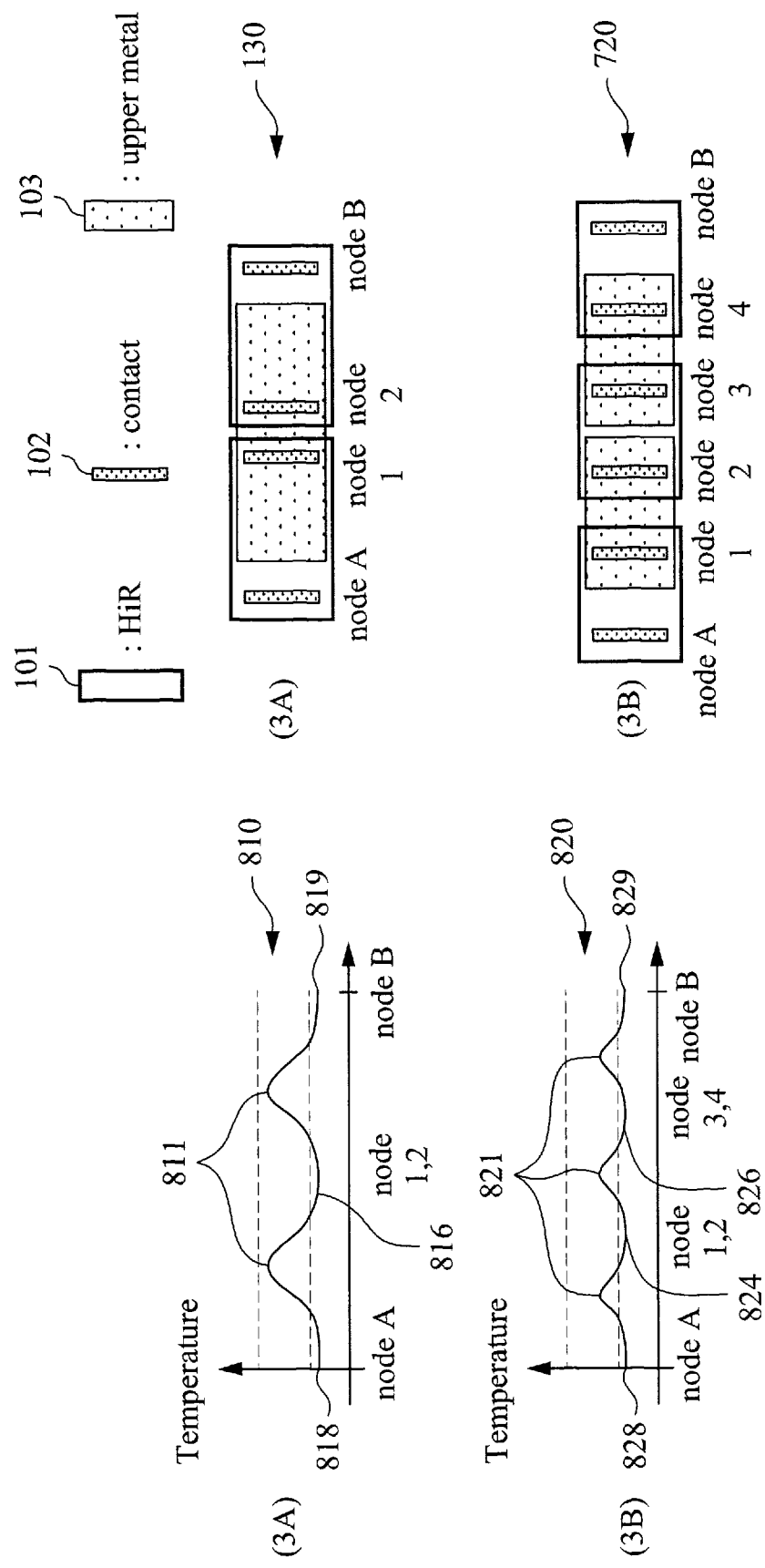
FIG. 8 illustrates temperature distributions of the exemplary semiconductor devices shown in FIG. 7, in accordance with some embodiments of the present disclosure.

FIG. 8 illustrates temperature distributions of the exemplary semiconductor devices shown in FIG. 7, in accordance with some embodiments of the present disclosure. For the embodiments (3A) 130 and (3B) 720, FIG. 8 shows corresponding temperature distributions 810 and 820, respectively, along an axis from node A to node B of the resistor.

As shown in FIG. 8, the temperature distribution 810 for the embodiment (3A) 130 has two low points 818, 819 at the two end nodes and one low flat region 816 at the intermediate node pair (nodes 1-2). As the intermediate node pair is located at the center of the resistor, there is no big hot spot at the resistor center in contrast to a conventional device without intermediate node pair, but there are two smaller hot spots 811 in between the nodes. In addition, compared to a conventional device without intermediate node pair, the overall temperature of the resistor in this embodiment is reduced.

Similarly, the temperature distribution 820 for the embodiment (3B) 720 has two low points 828, 829 at the two end nodes and two low flat regions 824, 826 at the intermediate node pairs (nodes 1-2 and nodes 3-4). Unlike a conventional device without intermediate node pair, there is no big hot spot at the resistor center here, but there are three smaller hot spots 821 in between the nodes. In addition, compared to a conventional device without intermediate node pair, the overall temperature of the resistor in this embodiment is reduced.

As shown in FIG. 8, more intermediate node pairs inserted between two ends of the resistor can bring a lower overall temperature and a flatter temperature distribution for the resistor including multiple sub-resistors connected in series. On the other hand, more intermediate node pairs may mean more cost for the device. As such, one can determine an optimal number of intermediate node pairs as well as an optimal number for the sub-resistors in the resistor, based on the tradeoff between temperature reduction and cost increase, as well as other concerns like sub-resistor and node geometry, performance requirement, etc.

Figure 9:
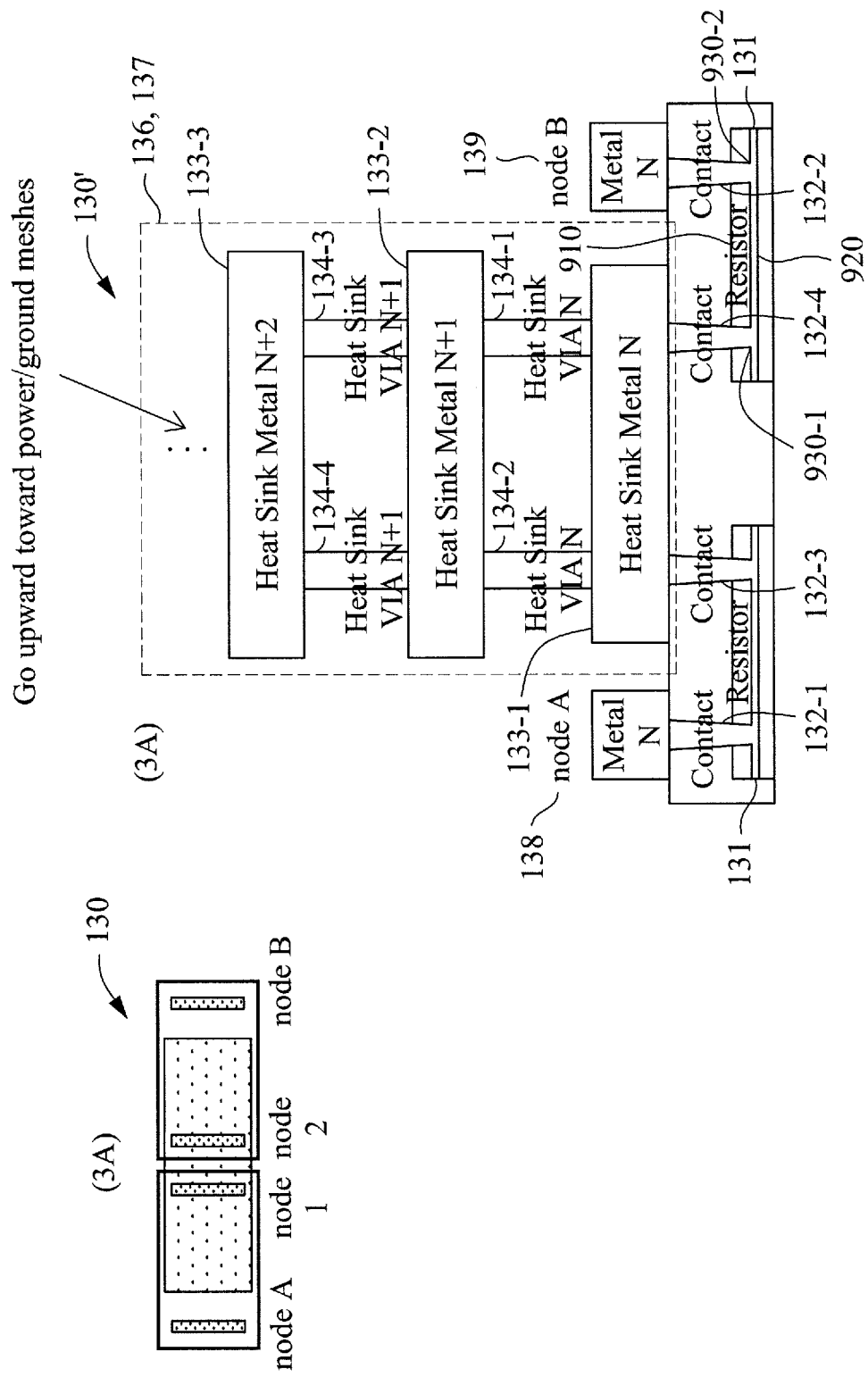
FIG. 9 illustrates a corresponding cross-sectional view of one of the exemplary semiconductor devices shown in FIG. 7, in accordance with some embodiments of the present disclosure.

FIG. 9 illustrates a corresponding cross-sectional view of one of the exemplary semiconductor devices shown in FIG. 7, in accordance with some embodiments of the present disclosure. FIG. 9 shows a cross-sectional view 130' for the embodiment (3A). In the cross-sectional view 130', each resistor 131 has a top surface 910, a bottom surface 920, and two end portions 930-1, 930-2. There are four contacts 132 disposed on the resistors 131, including two end contacts disposed at the two end portions of each resistor. There are two end nodes (node A 138 and node B 139) disposed on the two end contacts 132-1, 132-2 and one intermediate node pair 136-137 disposed on the intermediate contacts 132-3, 132-4. The node pair 136-137 in this example includes a plurality of metal layers (heat sink metals N 133-1, N+1 133-2, N+2 133-3, . . . ) and at least one via (heat sink vias N 134-1, 134-2, N+1 134-3, 134-4 . . . ) that thermally couples adjacent metal layers in the plurality of metal layers. The heat at the center of the resistor 131, i.e. at the connected area of the two sub-resistors connected in series in the resistor 131, can be dissipated via the node pair 136-137 to a large heat sink pool (e.g. a mesh power/ground plane) in the semiconductor device.

It can be understood that, in some embodiments, while the resistor is divided into multiple sub-resistors, one or more intermediate metal node pairs can be inserted below the resistor, and the heat in the center of the resistor can be dissipated via the one or more intermediate metal node pairs to the substrate of the device. It can also be understood that, in some embodiments, one resistor may have both an intermediate metal node pair disposed on top of the resistor and an intermediate metal node pair disposed below the resistor.

In accordance with some embodiments, the contacts on top of a resistor may be formed of Tungsten. In accordance with some embodiments, each metal layer or each heat sink metal may be formed of an aluminum alloy. In accordance with some embodiments, one can optimize the number of metal layers in an intermediate node pair, based on size of the device, cost of the device, material of the metal layers, and material of other portions of the device, etc. It can be understood that, when there are multiple intermediate node pairs on the resistor, the numbers and/or material of metal layers in different intermediate node pairs can be different.

Figure 10:
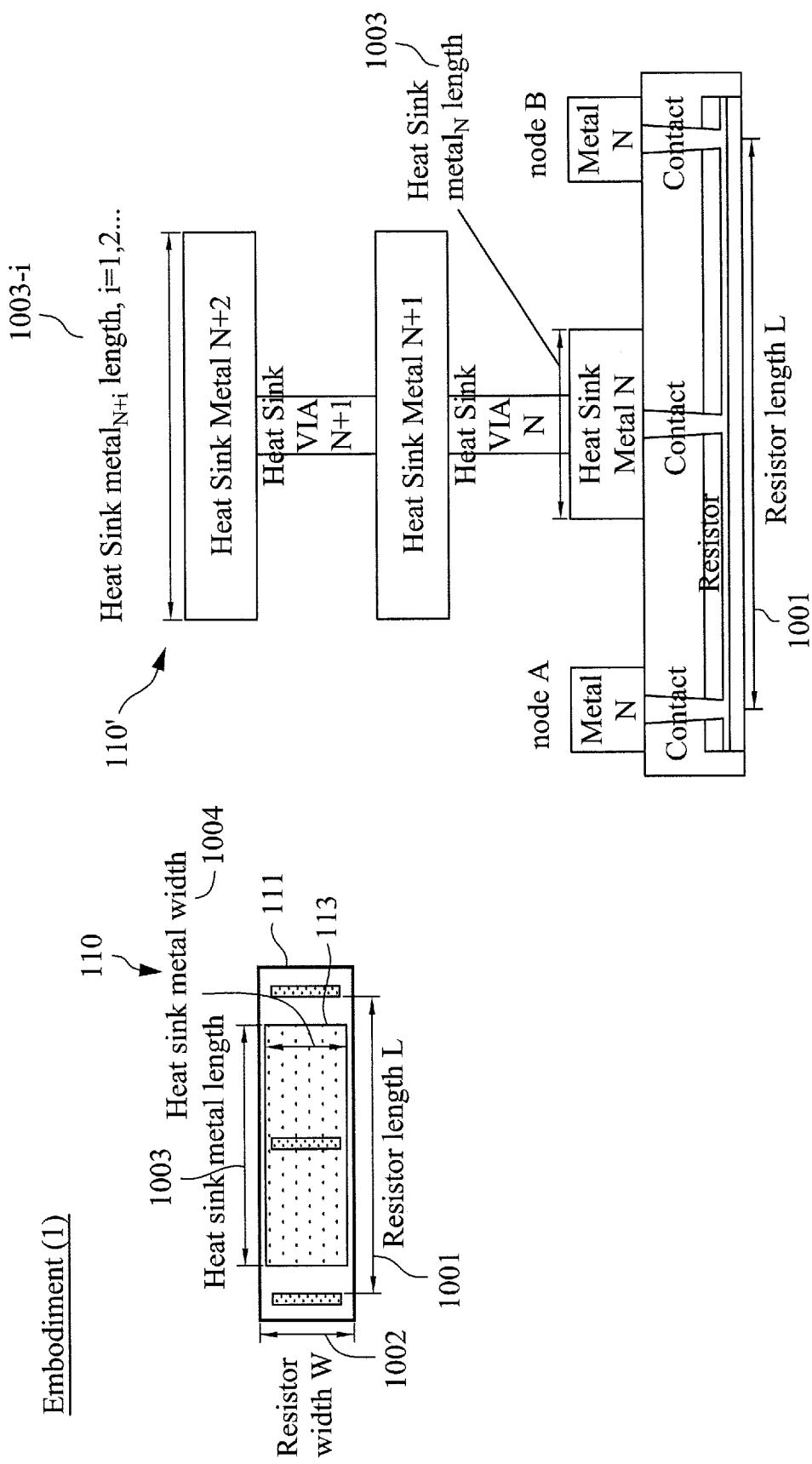
FIG. 10 illustrates a geometry design for the first set of exemplary semiconductor devices shown in FIG. 2, in accordance with some embodiments of the present disclosure.

FIG. 10 illustrates a geometry design for the first set of exemplary semiconductor devices shown in FIG. 2, in accordance with some embodiments of the present disclosure. In embodiment (1) 110, the resistor 111 has a resistor length L 1001 that is equal to a distance between the two end nodes, and has a resistor width W 1002 as shown in FIG. 10. The inserted intermediate heat sink metal has a metal length 1003 and a metal width 1004. To be more specific, when the heat sink node includes multiple metal layers, each heat sink metal layer may have a different metal length or width.

A goal of the geometry design for the heat sink node here is to reduce the parasitic capacitance in the semiconductor device. Before inserting the node, there is a parasitic capacitance between the resistor and the substrate of the device. The parasitic capacitance is proportional to a common area between the two plates forming the capacitance. In embodiment (1) as shown in FIG. 10, because the node is disposed on top of the resistor and is electrically connected to the resistor via a contact, the heat sink metal node insertion will not introduce much additional parasitic capacitance, especially when the node is fully covered or blocked by the resistor from the substrate, i.e. when there is no vertical straight line that can connect the node and the substrate without penetrating the resistor.

In some embodiments, the intermediate metal has a same geometry shape as the resistor and is placed in parallel with the resistor. As shown in FIG. 10, both the heat sink metal and the resistor have a rectangular shape in the top view of the device.

When the metal nodes include multiple metal layers, the metal layers include: a first metal layer (heat sink metal N) in contact with the corresponding contact on the resistor, and other metal layers (heat sink metal N+i, i=1,2 . . . ) disposed over the first metal layer. In some embodiments, each of the plurality of metal layers has a same shape as that of the resistor. In some embodiments, an area of each metal layer is smaller than or equal to that of the resistor.

In some embodiments, the first layer (heat sink metal N) has: (a) a first metal length 1003 that is less than or equal to the resistor length L 1001, and (b) a first metal width 1004 that is less than or equal to the resistor width W 1002; and each of the other layers (heat sink metal N+i) has: (c) a metal length 1003-i that is greater than or equal to the first metal length 1003, and (d) a metal width 1004-i that is greater than or equal to the first metal width 1004. In some embodiments, the first layer (heat sink metal N) has: (a) a first metal length 1003 that is selected from a range between 0.1*L and 1L, and (b) a first metal width 1004 that is selected from a range between 0.1*W and 40W; and each of the other layers (heat sink metal N+i) has: (c) a metal length 1003-i that is selected from a range between 0.1*L and 40L, and (d) a metal width 1004-i that is selected from a range between 0.1*W and 40W.

Figure 11:
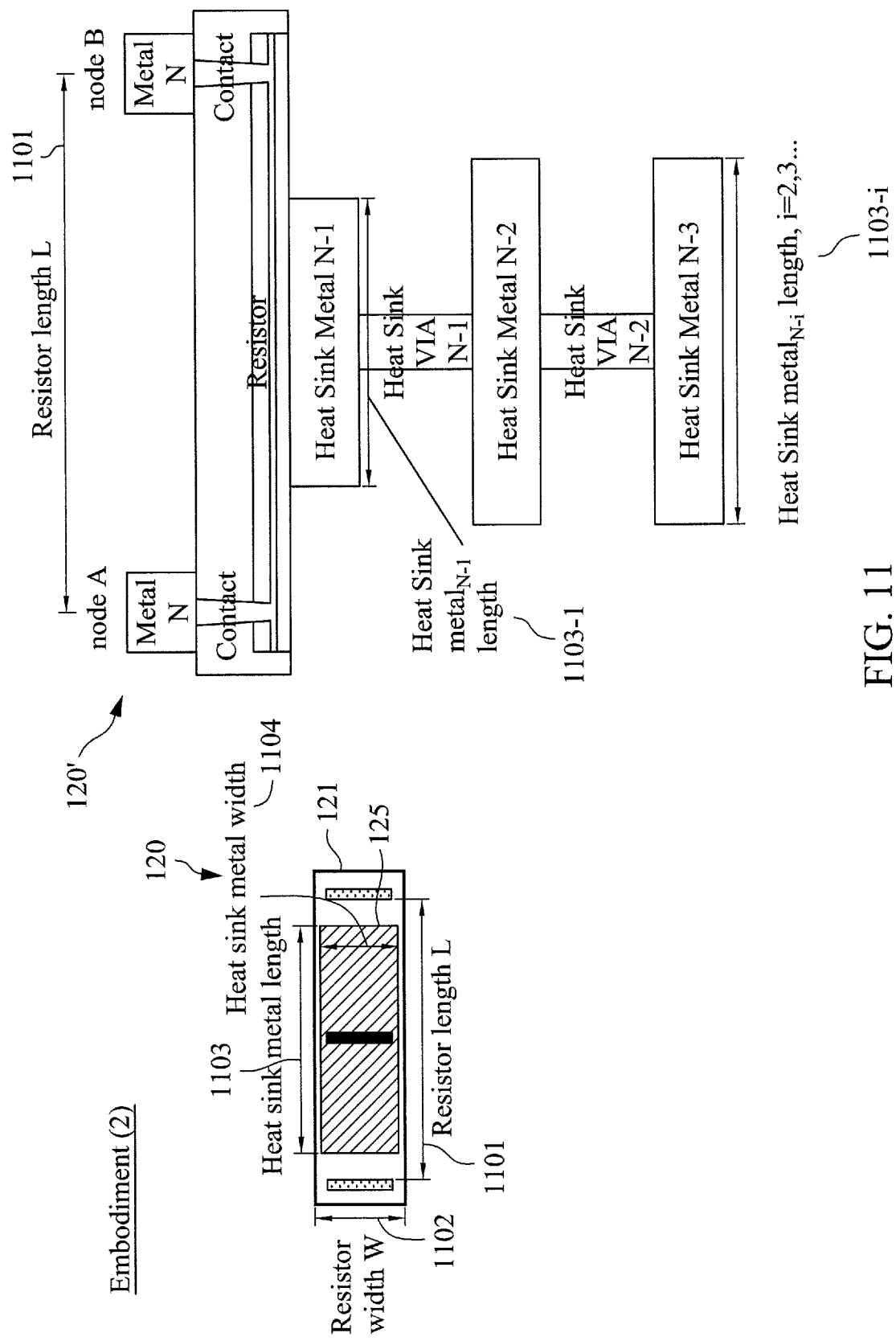
FIG. 11 illustrates a geometry design for the second set of exemplary semiconductor devices shown in FIG. 5, in accordance with some embodiments of the present disclosure.

FIG. 11 illustrates a geometry design for the second set of exemplary semiconductor devices shown in FIG. 5, in accordance with some embodiments of the present disclosure. In embodiment (2) 120, the resistor 121 has a resistor length L 1101 that is equal to a distance between the two end nodes, and has a resistor width W 1102 as shown in FIG. 11. The inserted intermediate heat sink metal has a metal length 1103 and a metal width 1104. To be more specific, when the heat sink node includes multiple metal layers, each heat sink metal layer may have a different metal length or width.

In embodiment (2) as shown in FIG. 11, because the node is disposed between the resistor and the substrate, and is not directly electrically connected to the resistor, the heat sink metal node insertion may introduce some additional parasitic capacitance to the device.

In some embodiments, the intermediate metal has a same geometry shape as the resistor and is placed in parallel with the resistor. As shown in FIG. 11, both the heat sink metal and the resistor have a rectangular shape in the top view of the device.

When the metal nodes include multiple metal layers, the metal layers include: a first metal layer (heat sink metal N−1) in contact with the dielectric layer under the resistor, and other metal layers (heat sink metal N−i, i=2,3 . . . ) disposed below the first metal layer. In some embodiments, each of the plurality of metal layers has a same shape as that of the resistor. In some embodiments, an area of each metal layer is smaller than or equal to that of the resistor.

In some embodiments, the first layer (heat sink metal N−1) has: (a) a first metal length 1103-1 that is less than or equal to the resistor length L 1101, and (b) a first metal width 1104 that is less than or equal to the resistor width W 1102; and each of the other layers (heat sink metal N−i) has: (c) a metal length 1103-i (i=2,3 . . . ) that is greater than or equal to the first metal length 1103, and (d) a metal width 1104-i (i=2,3 . . . ) that is greater than or equal to the first metal width 1104. In some embodiments, the first layer (heat sink metal N−1) has: (a) a first metal length 1103 that is selected from a range between 0.1*L and 1L, and (b) a first metal width 1104 that is selected from a range between 0.1*W and 40W; and each of the other layers (heat sink metal N−i) has: (c) a metal length 1103-i (i=2,3 . . . ) that is selected from a range between 0.1*L and 40L, and (d) a metal width 1104-i (i=2,3 . . . ) that is selected from a range between 0.1*W and 40W.

It can be understood that a geometry design for exemplary semiconductor devices in embodiment (3) can follow a similar manner to the geometry design for embodiments (1) and (2) shown in FIG. 10 and FIG. 11, respectively.

Figure 12:
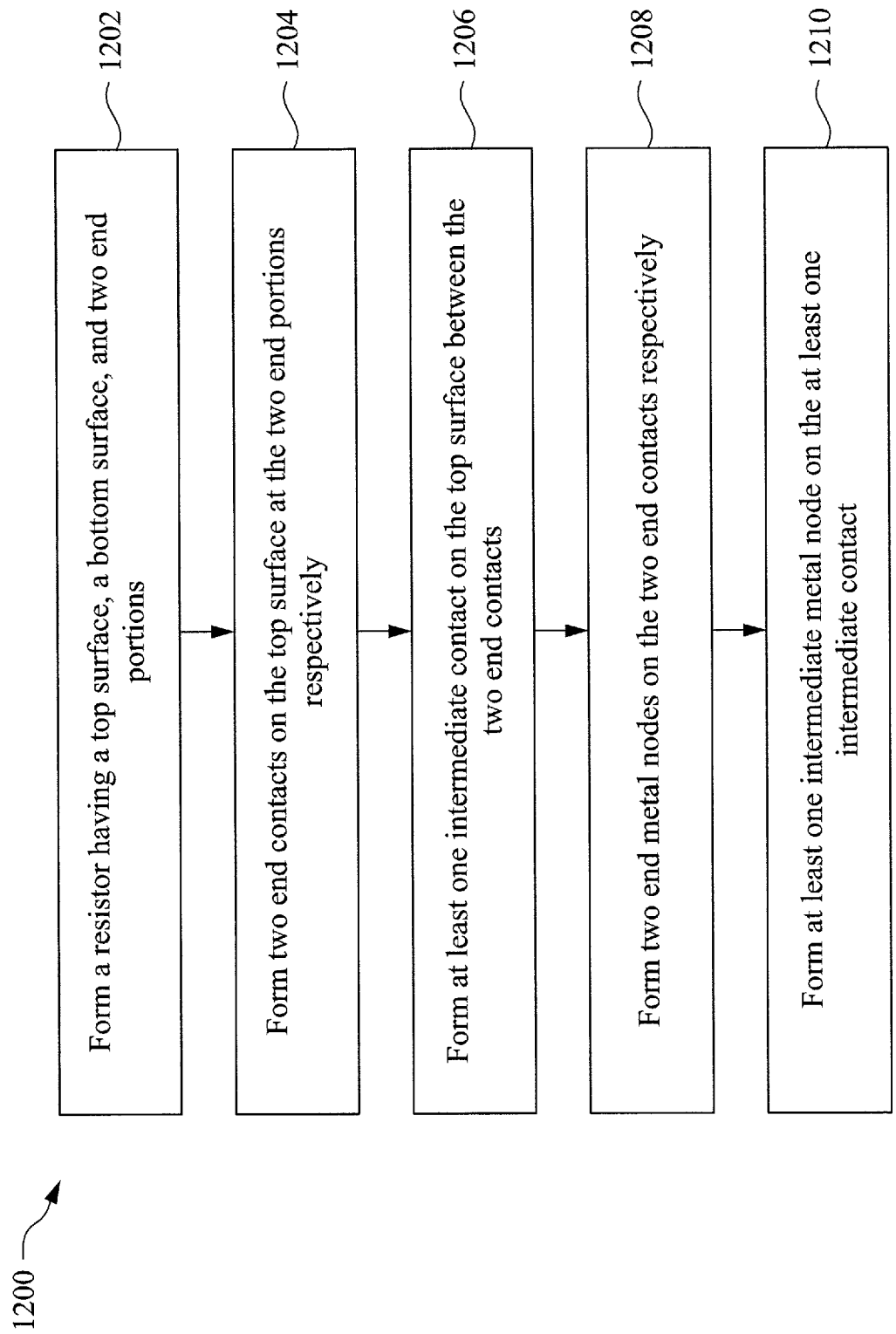
FIG. 12 is a flow chart illustrating an exemplary method for forming a semiconductor device, in accordance with some embodiments of the present disclosure.

FIG. 12 is a flow chart illustrating an exemplary method 1200 for forming a semiconductor device, in accordance with some embodiments of the present disclosure. As shown in FIG. 12, a resistor is formed at 1202, where the resistor has a top surface, a bottom surface, and two end portions. Two end contacts are formed at 1204 on the top surface at the two end portions respectively. At 1206, at least one intermediate contact is formed on the top surface between the two end contacts. Two end metal nodes are formed at 1208 on the two end contacts respectively. At 1210, at least one intermediate metal node is formed on the at least one intermediate contact.

Figure 13:
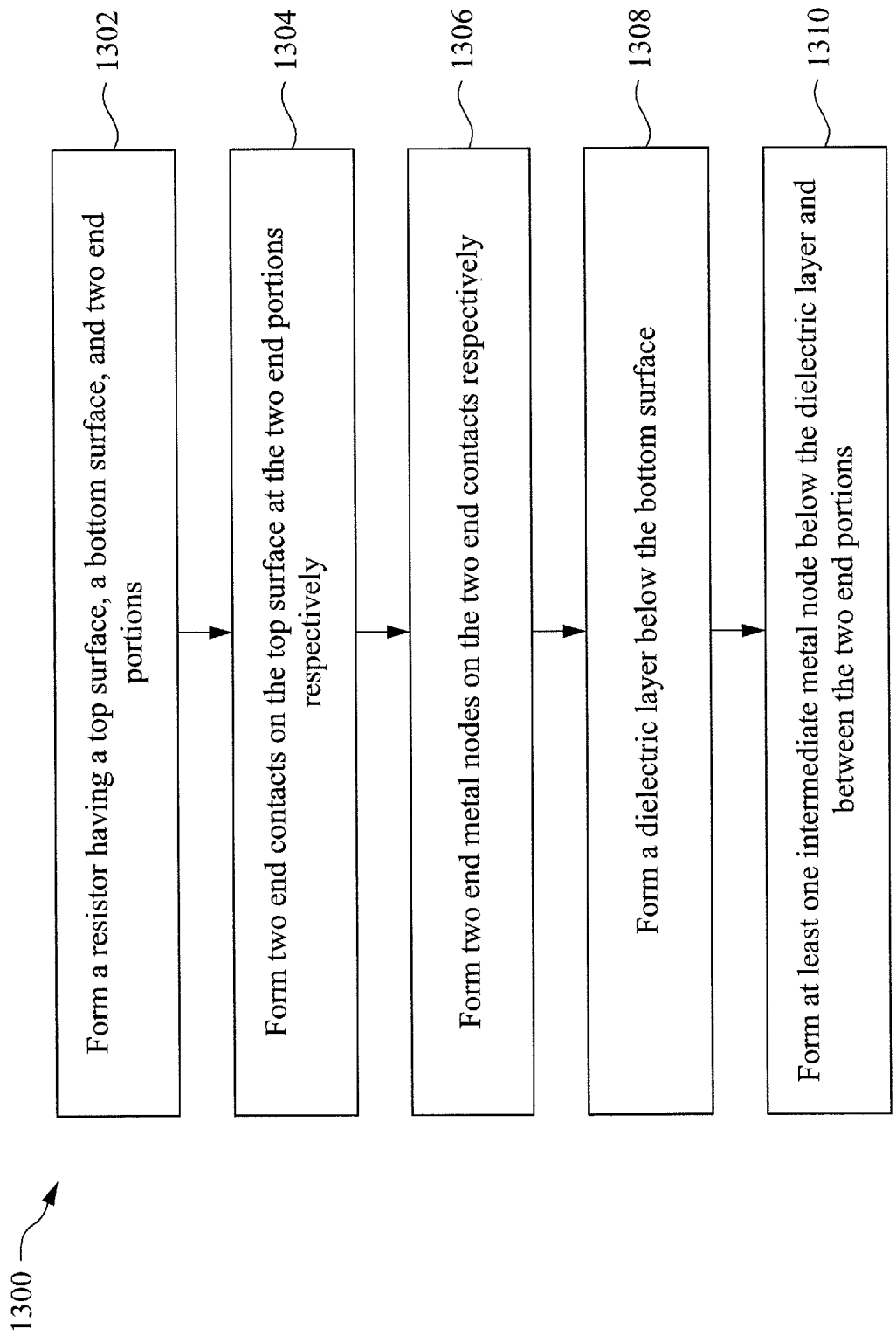
FIG. 13 is a flow chart illustrating another exemplary method for forming a semiconductor device, in accordance with some embodiments of the present disclosure.

FIG. 13 is a flow chart illustrating another exemplary method 1300 for forming a semiconductor device, in accordance with some embodiments of the present disclosure. As shown in FIG. 13, a resistor is formed at 1302, where the resistor has a top surface, a bottom surface, and two end portions. Two end contacts are formed at 1304 on the top surface at the two end portions respectively. Two end metal nodes are formed at 1306 on the two end contacts respectively. A dielectric layer is formed at 1308 below the bottom surface. At 1310, at least one intermediate metal node is formed below the dielectric layer and between the two end portions.

Figure 14:
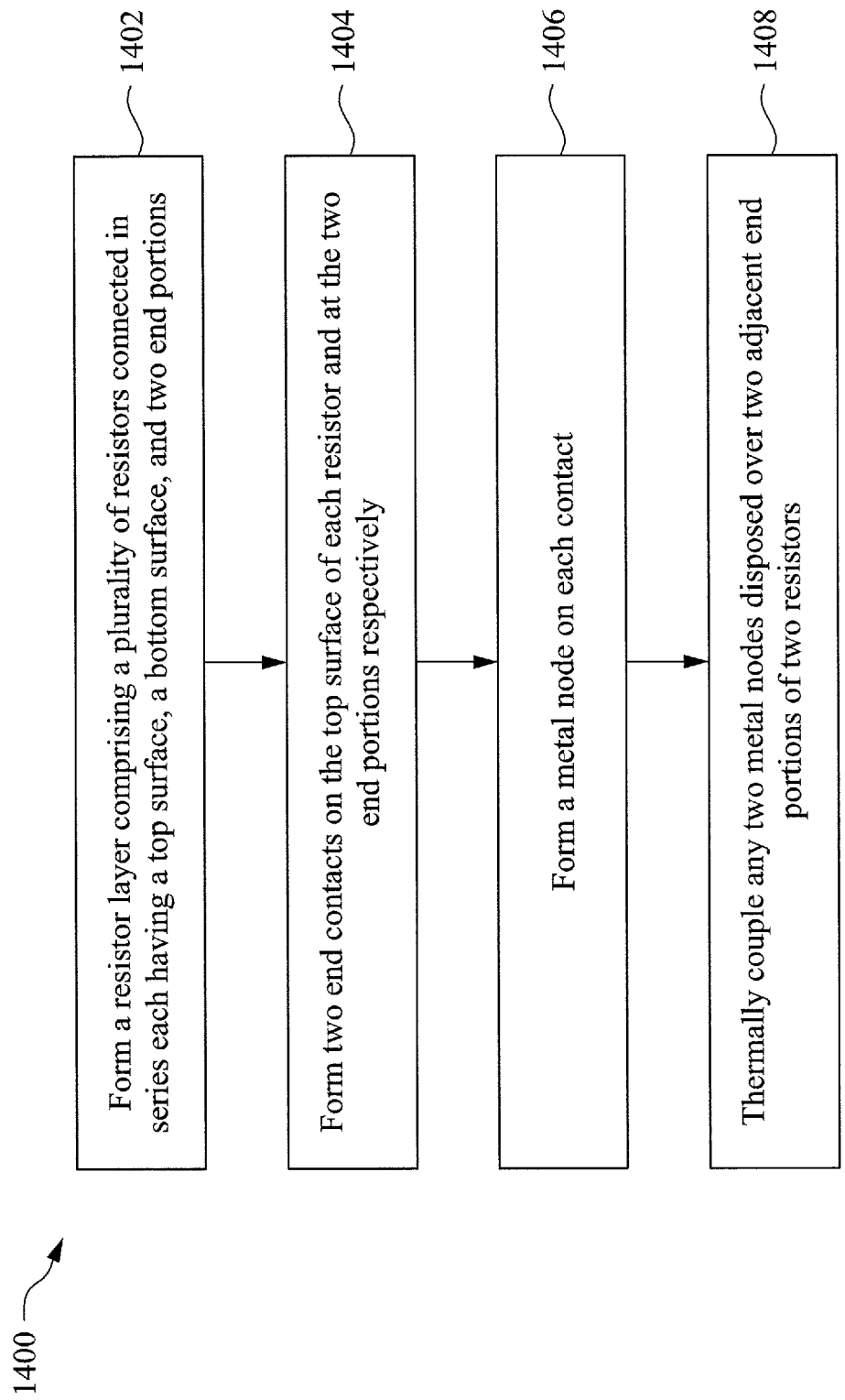
FIG. 14 is a flow chart illustrating yet another exemplary method for forming a semiconductor device, in accordance with some embodiments of the present disclosure.

FIG. 14 is a flow chart illustrating yet another exemplary method 1400 for forming a semiconductor device, in accordance with some embodiments of the present disclosure. As shown in FIG. 14, a resistor layer comprising a plurality of resistors connected in series is formed at 1402, where each of the plurality of resistors has a top surface, a bottom surface, and two end portions. Two end contacts are formed at 1404 on the top surface of each resistor at the two end portions of the resistor respectively. A metal node is formed at 1406 on each contact. At 1408, any two metal nodes disposed over two adjacent end portions of two resistors are thermally coupled, to form a pair of coupled metal nodes.

It can be understood that the order of the steps shown in each of FIG. 12, FIG. 13, and FIG. 14 may be changed according to different embodiments of the present disclosure.

In an embodiment, a semiconductor device is disclosed. The semiconductor device includes: an electronic component having a top surface, a bottom surface, and two end portions; a plurality of contacts disposed on the top surface; and a plurality of metal nodes disposed on the plurality of contacts. The plurality of contacts includes two end contacts disposed at the two end portions respectively and at least one intermediate contact disposed between the two end contacts. The plurality of metal nodes includes two end metal nodes disposed on the two end contacts respectively and at least one intermediate metal node disposed on the at least one intermediate contact.

In another embodiment, a semiconductor device is disclosed. The semiconductor device includes: an electronic component having a top surface, a bottom surface, and two end portions; two end contacts disposed on the top surface and at the two end portions respectively; two end metal nodes disposed on the two end contacts respectively; a dielectric layer disposed below the bottom surface; and at least one intermediate metal node disposed below the dielectric layer and between the two end portions.

In yet another embodiment, a semiconductor device is disclosed. The semiconductor device includes: an electronic component layer including a plurality of electronic components connected in series; a contact layer including a plurality of end contacts disposed on the electronic component layer; and a first metal node layer including a first plurality of metal nodes disposed on the contact layer. Each of the plurality of electronic components has a top surface, a bottom surface, and two end portions. The plurality of end contacts includes two end contacts disposed on the top surface of each of the plurality of electronic components. The two end contacts are disposed at the two end portions of the electronic component, respectively. Each of the first plurality of metal nodes is disposed on a corresponding one of the plurality of end contacts. Among the first plurality of metal nodes, any two metal nodes disposed over two adjacent end portions of two electronic components are thermally coupled to form a pair of coupled metal nodes.

The foregoing outlines features of several embodiments so that those ordinary skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
an electronic component having a top surface, a bottom surface, and two end portions;
a plurality of contacts disposed on the top surface, wherein the plurality of contacts includes
two end contacts disposed at the two end portions respectively, and
at least one intermediate contact disposed between the two end contacts; and
a plurality of metal nodes disposed on the plurality of contacts, wherein the plurality of metal nodes includes
two end metal nodes disposed on the two end contacts respectively, and
at least one intermediate metal node disposed on the at least one intermediate contact, wherein the at least one intermediate metal node further comprises a plurality of metal layers and at least one vertical interconnect access (via) that thermally couples adjacent metal layers in the plurality of metal layers.

2. The device of claim 1, wherein the plurality of metal layers in the at least one intermediate metal node further comprises:
a first metal layer in contact with the corresponding contact, wherein the first metal layer has (a) a first length that is less than or equal to a length of the electronic component and (b) a first width that is less than or equal to a width of the electronic component; and
a second metal layer disposed over the first metal layer, wherein the second metal layer has (c) a second length that is greater than or equal to the first length and (d) a second width that is greater than or equal to the first width.

3. The device of claim 1, wherein:
each of the plurality of metal layers in the at least one metal node has a same shape as that of the electronic component; and
an area of each metal layer is smaller than or equal to that of the electronic component.

4. The device of claim 1, further comprising a ground plane disposed above the plurality of metal nodes, wherein the at least one intermediate metal node thermally couples the electronic component to the ground plane.

5. The device of claim 1, further comprising a power plane disposed above the plurality of metal nodes, wherein the at least one intermediate metal node thermally couples the electronic component to the power plane.

6. The device of claim 1, further comprising:
a dielectric layer disposed below the bottom surface; and at least one metal node disposed below the dielectric layer, wherein each of the at least one metal node is disposed between the two end portions.

7. The device of claim 1, wherein the electronic component is formed of a high resistance material.

8. A semiconductor device, comprising:
an electronic component having a top surface, a bottom surface, and two end portions;
two end contacts disposed on the top surface, wherein the two end contacts are disposed at the two end portions respectively;
two end metal nodes disposed on the two end contacts respectively;
a dielectric layer disposed below the bottom surface; and
at least one intermediate metal node disposed below the dielectric layer and between the two end portions, wherein the at least one intermediate metal node comprises a plurality of metal layers and at least one via that thermally couples adjacent metal layers in the plurality of metal layers.

9. The device of claim 8, wherein the plurality of metal layers in the at least one intermediate metal node further comprises:
a first metal layer in contact with the dielectric layer, wherein the first metal layer has (a) a first length that is less than or equal to a length of the electronic component and (b) a first width that is less than or equal to a width of the electronic component; and
a second metal layer disposed below the first metal layer, wherein the second metal layer has (c) a second length that is greater than or equal to the first length and (d) a second width that is greater than or equal to the first width.

10. The device of claim 8, further comprising a substrate disposed below the at least one intermediate metal node, wherein the at least one intermediate metal node thermally couples the electronic component to the substrate.

11. The device of claim 8, wherein the electronic component is formed of a high resistance material.

12. A semiconductor device, comprising:
an electronic component layer comprising a plurality of electronic components connected in series, wherein each of the plurality of electronic components has a top surface, a bottom surface, and two end portions;
a contact layer comprising a plurality of end contacts disposed on the electronic component layer, wherein
the plurality of end contacts comprises two end contacts disposed on the top surface of each of the plurality of electronic components, and
the two end contacts are disposed at the two end portions of the electronic component, respectively; and
a first metal node layer comprising a first plurality of metal nodes disposed on the contact layer, wherein
each of the first plurality of metal nodes is disposed on a corresponding one of the plurality of end contacts, and
among the first plurality of metal nodes, any two metal nodes disposed over two adjacent end portions of two electronic components are thermally coupled to form at least one intermediate metal node, wherein the at least one intermediate metal node comprises a plurality of metal layers and at least one via that thermally couples adjacent metal layers in the plurality of metal layers.

13. The device of claim 12, wherein the plurality of metal layers in the at least one intermediate metal node further comprises: a first metal layer in contact with the contact layer, wherein the first metal layer has (a) a first length that is less than or equal to a length of the electronic component layer and (b) a first width that is less than or equal to a width of the electronic component layer; and a second metal layer disposed over the first metal layer, wherein the second metal layer has (c) a second length that is greater than or equal to the first length and (d) a second width that is greater than or equal to the first width.

14. The device of claim 12, further comprising a ground plane disposed above the first metal node layer, wherein at least one pair of coupled metal nodes thermally couples the electronic component layer to the ground plane.

15. The device of claim 12, further comprising a power plane disposed above the first metal node layer, wherein at least one pair of coupled metal nodes thermally couples the electronic component layer to the power plane.

16. The device of claim 12, further comprising:
a dielectric layer disposed below the electronic component layer; and
a second metal node layer comprising a second plurality of metal nodes disposed below the dielectric layer, wherein
each of the second plurality of metal nodes is disposed below an end portion of one of the plurality of electronic components, and
among the second plurality of metal nodes, any two metal nodes disposed below two adjacent end portions of two electronic components are thermally coupled to each other.

17. The device of claim 12, wherein each of the plurality of electronic components is formed of a high resistance material.

18. A method for forming a semiconductor device, comprising:
forming an electronic component having a top surface, a bottom surface, and two end portions;
forming a plurality of contacts on the top surface, wherein the plurality of contacts includes
two end contacts disposed at the two end portions respectively, and
at least one intermediate contact disposed between the two end contacts; and
forming a plurality of metal nodes on the plurality of contacts, wherein the plurality of metal nodes includes
two end metal nodes disposed on the two end contacts respectively, and
at least one intermediate metal node disposed on the at least one intermediate contact, wherein the at least one intermediate metal node comprises a plurality of metal layers and at least one vertical interconnect access (via) that thermally couples adjacent metal layers in the plurality of metal layers.

19. The method of claim 18, wherein the plurality of metal layers in the at least one intermediate metal node comprises:
a first metal layer in contact with the corresponding contact, wherein the first metal layer has (a) a first length that is less than or equal to a length of the electronic component and (b) a first width that is less than or equal to a width of the electronic component; and
a second metal layer disposed over the first metal layer, wherein the second metal layer has (c) a second length that is greater than or equal to the first length and (d) a second width that is greater than or equal to the first width.

20. The method of claim 18, wherein:

each of the plurality of metal layers in the at least one metal node has a same shape as that of the electronic component; and an area of each metal layer is smaller than or equal to that of the electronic component.

21. The method of claim 18, further comprising forming a ground plane above the plurality of metal nodes, wherein the at least one intermediate metal node thermally couples the electronic component to the ground plane.

22. The method of claim 18, further comprising forming a power plane above the plurality of metal nodes, wherein the at least one intermediate metal node thermally couples the electronic component to the power plane.

23. The method of claim 18, further comprising:

forming a dielectric layer below the bottom surface; and forming at least one metal node below the dielectric layer, wherein each of the at least one metal node is disposed between the two end portions.

24. The method of claim 18, wherein the electronic component is formed of a high resistance material.

* * * * *